United States Patent
Zhai et al.

(10) Patent No.: US 8,441,259 B2
(45) Date of Patent: May 14, 2013

(54) TRANSMIT/RECEIVE COIL FOR ULTRA-HIGH FIELD MRI

(75) Inventors: Zhiyong Zhai, Mayfield Heights, OH (US); Robert Gauss, Aurora, OH (US); Eddy Yu Ping Wong, Richmond Heights, OH (US); Michael A. Morich, Mentor, OH (US); Kevin M. Nieman, Avon, OH (US); Gordon D. DeMeester, Wickliffe, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 404 days.

(21) Appl. No.: 12/742,976

(22) PCT Filed: Dec. 12, 2008

(86) PCT No.: PCT/IB2008/055234
§ 371 (c)(1),
(2), (4) Date: May 14, 2010

(87) PCT Pub. No.: WO2009/074965
PCT Pub. Date: Jun. 18, 2009

(65) Prior Publication Data
US 2011/0115483 A1 May 19, 2011

Related U.S. Application Data

(60) Provisional application No. 61/012,964, filed on Dec. 12, 2007.

(51) Int. Cl.
*G01V 3/00* (2006.01)
(52) U.S. Cl.
USPC .......................................................... 324/318
(58) Field of Classification Search ........... 324/300–322
See application file for complete search history.

(56) References Cited

U.S. PATENT DOCUMENTS 4,881,034 A 11/1989 Kaufman et al.
5,374,890 A * 12/1994 Zou et al. ...................... 324/318
(Continued)

FOREIGN PATENT DOCUMENTS

DE 102005039686 B3 5/2007
WO 2006076624 A1 7/2006
(Continued)

OTHER PUBLICATIONS

Gotshal, S.; High Frequency Transmit-Receive Phased Array Coil for Head and Neck MR Neuroimaging at 3 TESLA; 2003; A Thesis-U. of Florida; Chapter 4; pp. 40-53.

(Continued)

*Primary Examiner* — Dixomara Vargas (57) ABSTRACT

A magnetic resonance coil comprises a first set of coil elements (54, 56, 80) operatively connectable with a transmit channel (66, 74) to couple with a transmit region of sensitivity for a selected load at a magnetic field strength greater than 3 Tesla, and a second set of coil elements (52, 54, 82) operatively connectable with a receive channel (66, 74) to couple with a receive region of sensitivity for the selected load at the magnetic field strength greater than 3 Tesla. The first set of coil elements is arranged proximate to but not surrounding the transmit region of sensitivity, and the second set of coil elements is arranged proximate to but not surrounding the receive region of sensitivity. The first set of coil elements and the second set of coil elements having at least one coil element (52, 56) not in common. The first and second sets of coil elements define transmit and receive regions of sensitivity for the selected load at the magnetic field strength greater than 3 Tesla that are substantially similar.

14 Claims, 5 Drawing Sheets

U.S. PATENT DOCUMENTS

| | | | | |
|---|---|---|---|---|
| 5,457,386 | A * | 10/1995 | Matsunaga et al. | 324/318 |
| 5,592,088 | A * | 1/1997 | Matsunaga et al. | 324/318 |
| 5,666,055 | A * | 9/1997 | Jones et al. | 324/318 |
| 5,682,098 | A * | 10/1997 | Vij | 324/318 |
| 5,951,474 | A * | 9/1999 | Matsunaga et al. | 600/422 |
| 6,177,795 | B1 * | 1/2001 | Zhu et al. | 324/307 |
| 6,377,044 | B1 * | 4/2002 | Burl et al. | 324/307 |
| 6,437,567 | B1 * | 8/2002 | Schenck et al. | 324/318 |
| 6,608,480 | B1 | 8/2003 | Weyers | |
| 6,639,406 | B1 * | 10/2003 | Boskamp et al. | 324/318 |
| 6,930,480 | B1 * | 8/2005 | Fujita et al. | 324/318 |
| 6,940,282 | B2 | 9/2005 | Dumoulin et al. | |
| 6,975,115 | B1 * | 12/2005 | Fujita et al. | 324/318 |
| 7,026,818 | B2 * | 4/2006 | Machida et al. | 324/322 |
| 7,049,819 | B2 * | 5/2006 | Chan et al. | 324/319 |
| 7,176,689 | B2 * | 2/2007 | Machida et al. | 324/318 |
| 7,336,074 | B2 * | 2/2008 | Yang et al. | 324/318 |
| 7,733,088 | B2 * | 6/2010 | Cho et al. | 324/318 |
| 7,746,073 | B2 * | 6/2010 | Cho et al. | 324/318 |
| 7,852,084 | B2 * | 12/2010 | Zhai et al. | 324/318 |
| 7,884,609 | B2 * | 2/2011 | Soutome et al. | 324/322 |
| 8,030,926 | B2 * | 10/2011 | Avdievich et al. | 324/318 |
| 8,232,802 | B2 * | 7/2012 | Okamoto et al. | 324/318 |
| 2003/0122546 | A1 | 7/2003 | Leussler | |
| 2004/0155656 | A1 | 8/2004 | Leussler | |
| 2007/0241753 | A1 | 10/2007 | Sodickson et al. | |

FOREIGN PATENT DOCUMENTS

| | | |
|---|---|---|
| WO | 2006094354 A1 | 9/2006 |
| WO | 2006114749 A1 | 11/2006 |
| WO | 2007098011 A2 | 8/2007 |

OTHER PUBLICATIONS

Junge, S., et al.; Six channel Transmit-Receive Coil Array for Whole Body Imaging at 4T; 2006; Proc. Intl. Soc. Mag. Reson. Med.; 14:124.

Wang, J., et al.; Polarization of the RF Field in a Human Head at High Field: A Study with a Quadrature Surface Coil at 7.0T; 2002; MRM; 48:362-369.

* cited by examiner

Transmit
$|B_1^+|$-field

Receive
$|B_1^-|$-field

TRANSMIT/RECEIVE COIL FOR ULTRA-HIGH FIELD MRI

CROSS REFERENCE TO RELATED APPLICATIONS

This application claims the benefit of U.S. provisional application Ser. No. 61/012,964 filed Dec. 12, 2007, which is incorporated herein by reference.

FIELD OF THE INVENTION

The following relates to the magnetic resonance arts. The following finds illustrative application to magnetic resonance imaging and spectroscopy, and is described with particular reference thereto. However, the following will find application in other magnetic resonance and radio frequency applications.

BACKGROUND

At low magnetic field, for example at 1.5 Tesla, the magnetic resonance frequency is relatively low, resulting in a corresponding radio frequency (RF) wavelength that is relatively long compared to the size of the object. As a result, a low magnetic field tends to provide good spatial uniformity on the scale of a typical human anatomical region of interest (e.g., head, torso, limb, or so forth). Accordingly, those skilled in the art have typically employed a volume coil such as a birdcage coil for magnetic resonance excitation, and have used a volume coil or a local coil (possibly comprising a plurality of coil elements) for magnetic resonance signal reception. The tendency toward good spatial uniformity for magnetic resonance at low magnetic field has led to substantial clinical and diagnostic success with such systems. However, low magnetic field has certain disadvantages with acquisition time constraints in mind, such as relatively lower spatial resolution, lower signal strength and correspondingly lower signal-to-noise ratio (SNR), and so forth.

Accordingly, there has been continued interest in performing magnetic resonance imaging and spectroscopy at higher magnetic fields. At high magnetic field, for example at 7 Tesla, the magnetic resonance frequency is substantially higher (in proportion to the main field), the corresponding radio frequency (RF) wavelength is substantially shorter, and tissue properties and object shape (load) can lead to substantial $B_1$ non-uniformity on the scale of a typical human head or extremity such as calf. As a result, at high magnetic field those skilled in the art have explored ways to improve $B_1$ uniformity for head imaging and use local coils for other anatomical regions for both magnetic resonance excitation and reception.

At 1.5 Tesla, if the same surface coil (which, again, may be an array or other plurality of coil elements) is used for both excitation and reception, it has generally been accepted that the coil will excite and read from the same region of sensitivity of the proximate load. This is because the $|B_1^+|$ transmit field and the $|B_1^-|$ field sensed by the coil are both reasonably similar, having regions of sensitivity that substantially overlap. At higher fields like 7 T, the region of sensitivity may exhibit substantial load-induced non-uniformity and asymmetry, even for a uniform object. Even worse, the transmit and receive sensitivity patterns are different spatially. Sensitivity in this context refers to the $|B_1^+|$ field that is generated at a spatial point per unit current and the $|B_1^-|$ spatial field intensity that can generate a unit of current in the receive antenna. Recognition of the erroneous presumption that the transmit and receive fields substantially overlap has led to certain improvements in the art as disclosed herein.

SUMMARY OF THE INVENTION

In accordance with certain illustrative embodiments shown and described as examples herein, a magnetic resonance coil is disclosed, comprising: a first set of coil elements operatively connectable with a transmit channel to couple with a transmit region of sensitivity for a selected load at a magnetic field strength, the first set of coil elements being arranged proximate to but not surrounding the transmit region of sensitivity; a second set of coil elements operatively connectable with a receive channel to couple with a receive region of sensitivity for the selected load at the magnetic field strength, the second set of coil elements being arranged proximate to but not surrounding the receive region of sensitivity; the first set of coil elements and the second set of coil elements having at least one coil element not in common; and the first and second sets of coil elements defining substantially similar transmit and receive regions of sensitivity for the selected load at the magnetic field strength.

In accordance with certain illustrative embodiments shown and described as examples herein, a magnetic resonance coil is disclosed, comprising: a first set of coil elements operatively connectable with a transmit channel to couple with a selected region of sensitivity of a selected load at a magnetic field strength; and a second set of coil elements operatively connectable with a receive channel to couple with the same selected region of sensitivity of the selected load at the magnetic field strength; the first set of coil elements and the second set of coil elements being spatially offset from each other and having at least one coil element not in common.

In accordance with certain illustrative embodiments shown and described as examples herein, a magnetic resonance method is disclosed, comprising: positioning a first set of coil elements asymmetrically respective to a selected region of sensitivity of a selected load at a magnetic field strength; positioning a second set of coil elements asymmetrically respective to the selected region of sensitivity of the selected load at the magnetic field strength, the asymmetric position of the second set of coil elements respective to the selected region of sensitivity being different from the asymmetric position of the first set of coil elements respective to the selected region of sensitivity; generating magnetic resonance in the selected region of sensitivity of the selected load at the magnetic field strength using the asymmetrically positioned first set of coil elements; and receiving a magnetic resonance signal from the selected region of sensitivity of the selected load at the magnetic field strength using the differently asymmetrically positioned second set of coil elements.

One advantage resides in improved correspondence between the transmit and receive sensitivity regions.

Another advantage resides in improved magnetic resonance at high magnetic field.

Another advantage resides in magnetic resonance coils with improved performance at high magnetic field.

Another advantage resides in better targeting of magnetic resonance excitation and signal reception.

Still further advantages of the present invention will be appreciated by those of ordinary skill in the art upon reading and understand the following detailed description.

BRIEF DESCRIPTION OF THE DRAWINGS

These and other aspects will be described in detail hereinafter, by way of example, on the basis of the following embodiments, with reference to the accompanying drawings, wherein.

DETAILED DESCRIPTION OF EMBODIMENTS

Figure 1:
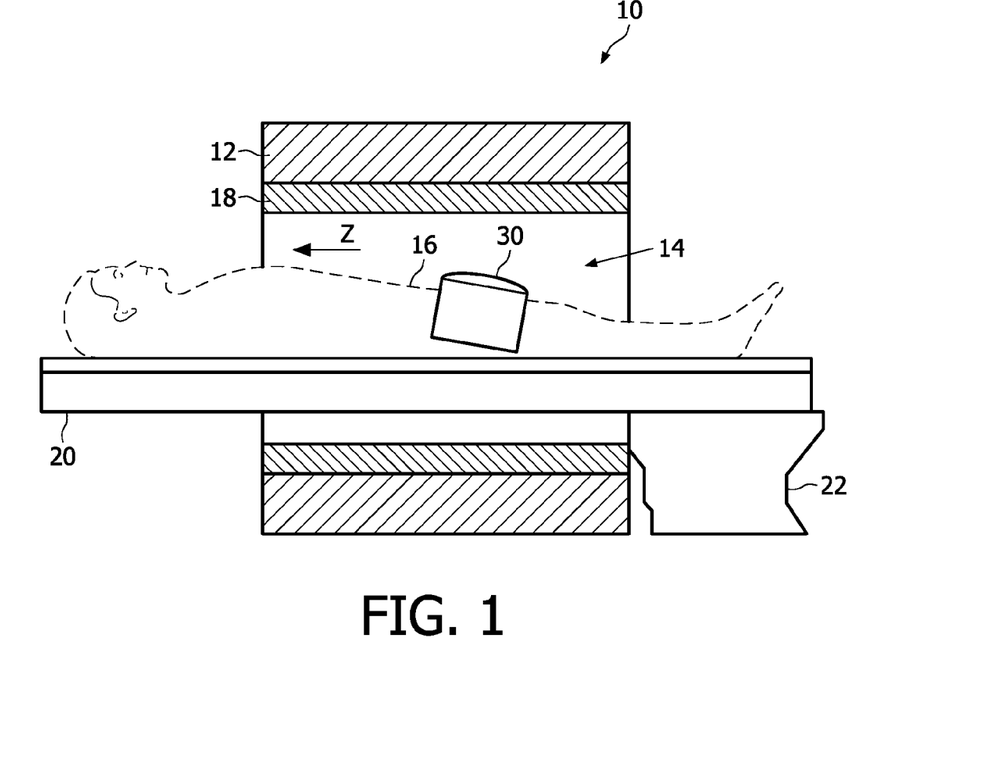
FIG. 1 diagrammatically shows a magnetic resonance scanner system.

With reference to FIG. 1, a magnetic resonance scanner 10 includes a main magnet 12 generating a static ($B_0$) magnetic field having a field direction oriented parallel or anti-parallel with an axial or "z" direction (indicated in FIG. 1) in an examination region 14 in which is disposed a subject 16 (shown in dashed line in FIG. 1). The illustrated magnetic resonance scanner 10 is a horizontal bore-type scanner shown in cross-section to reveal selected components; however, other types of magnetic resonance scanners can be used. The magnetic resonance scanner 10 is a high-field scanner in which the main magnet 12 produces the static main magnetic field (also known as $B_0$ magnetic field) in the examination region 14 at a magnetic field strength greater than 3 Tesla, and in some embodiments greater than or about 5 Tesla. In some embodiments, the main magnet 12 produces a static ($B_0$) magnetic field in the examination region 14 at a magnetic field strength of 7 Tesla. Higher magnetic field strengths are also contemplated.

The magnetic resonance scanner 10 also includes magnetic field gradient coils 18 that superimpose selected magnetic field gradients on the static ($B_0$) magnetic field to perform various tasks such as spatially restricting magnetic resonance excitation, spatially encoding magnetic resonance frequency and/or phase, spoiling magnetic resonance, or so forth. Optionally, the magnetic resonance scanner may include other elements not shown in FIG. 1, such as a bore liner, active coil or passive ferromagnetic shims, or so forth. The subject 16 is suitably prepared by being placed on a movable subject support 20 which is then inserted along with the supported subject 16 into the illustrated position for magnetic resonance acquisition. For example, the subject support 20 may be a pallet or table that is initially disposed on a couch 22 adjacent the magnetic resonance scanner 10, the subject 16 placed onto the support 20 and then slidably transferred from the couch 22 into the bore of the magnetic resonance scanner 10.

Figure 2:
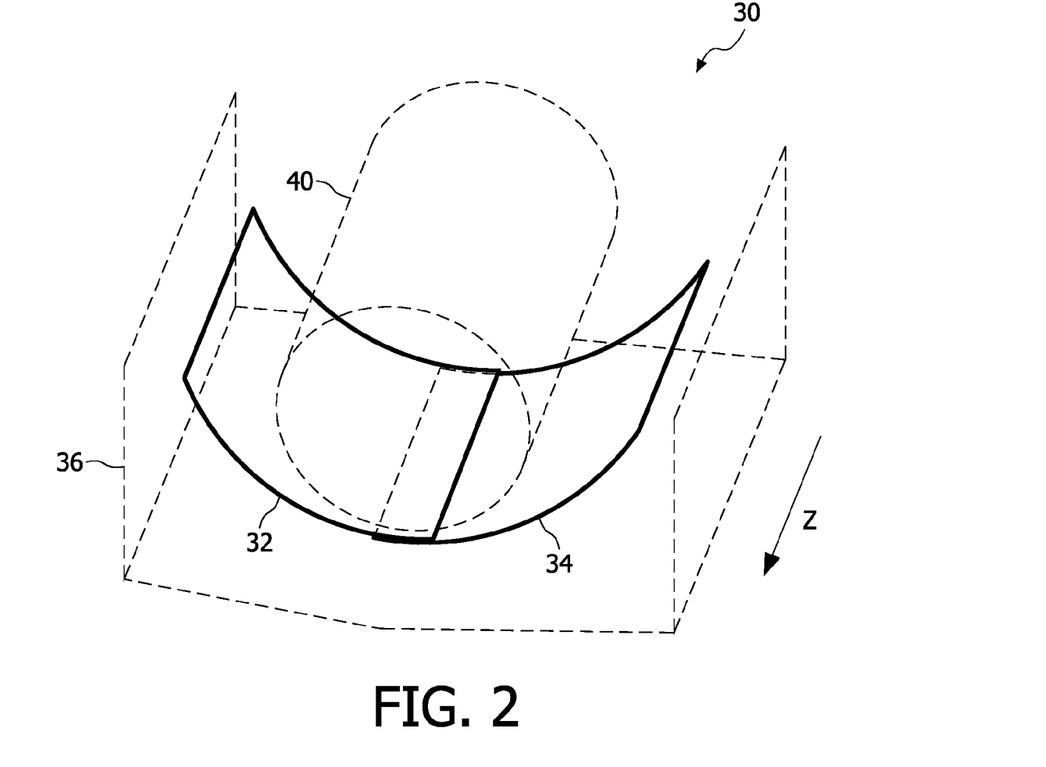
FIG. 2 diagrammatically shows a magnetic resonance coil including two surface coil elements used in the system of FIG. 1. The coil aligns along the direction of main magnetic field $B_0$ (z-axis)

With continuing reference to FIG. 1 and with further reference to FIG. 2, a magnetic resonance coil 30 is disposed on or with the subject 16 in the examination region 14. As seen in FIG. 2, the magnetic resonance coil 30 includes two surface coil elements 32, 34 disposed on the subject 16, and a distally located radio frequency screen or shield 36 which can have beneficial effects such as reducing stray radio frequency interference, enhancing coupling with the subject at the magnetic resonance frequency, or so forth. The illustrated coil elements 32, 34 laterally overlap slightly; however, in other embodiments the coils may be spaced apart or precisely adjoining with no overlap. In FIG. 2, a region of sensitivity 40 with which the radio frequency coil 30 is intended to couple is diagrammatically indicated in dotted line. In the illustrated example, the region of sensitivity 40 is cylindrical and comports approximately with a curvature of the surface coil elements 32, 34; however, otherwise-shaped or oriented regions of interest are also contemplated. The example shown reasonably simulates an adult human lower extremity.

In the illustrative example of FIG. 2, the coil 30 is a half-volume or partial-volume surface coil of a type sometimes used at 1.5 T or 3 T, typically as a receive only coil, or at 4 T as a transmit/receive coil. The coil is made of the two curved loop coil elements 32, 34 suitable for human calf imaging or spectroscopy. The nucleus of interest is $^1$H (64 MHz at 1.5 T, 128 MHz at 3 T and 298 MHz at 7 T). To simulate coil performance at high magnetic field, the coil 30 was simulated using a finite difference time domain (FDTD) modeling method, with the coil loaded with a uniform 11.4 cm-diameter cylindrical phantom ($\sigma$=0.855 S/m, $\epsilon_r$=80) to represent portion of a leg in a 7 Tesla $B_0$ field. The left loop 32 and right loop 34 are both used during transmit and receive through a 90° quadrature transmit/receive switch box (not shown). At 1.5 T or 3 T the coil array is expected to generate relatively uniform and symmetrical $B_1$ in the bottom region of the phantom with some regular gradation from top to bottom.

Figure 3:
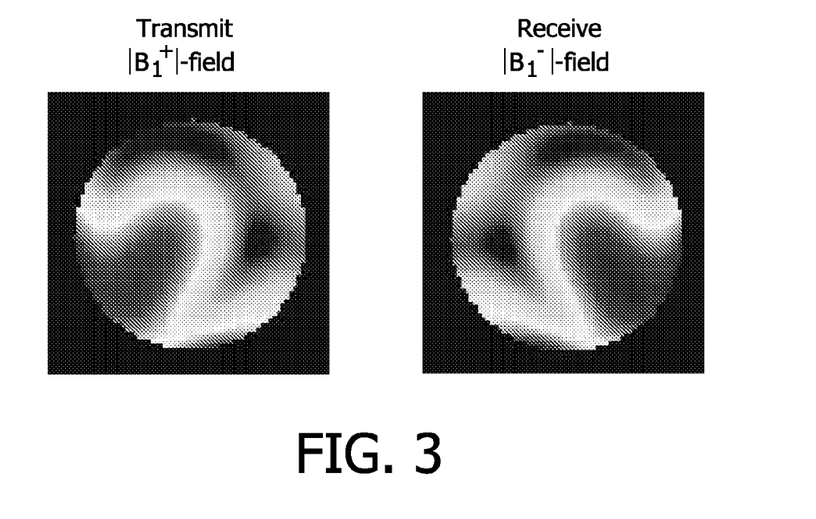
FIG. 3 plots finite difference time domain (FDTD) modeling results of the quadrature transmit $|B_1^+|$ field (lefthand side) and quadrature receive $|B_1^-|$ field (righthand side) in the center transverse slice for the coil of FIG. 2 loaded with a uniform cylindrical object. Higher $B_1$ field strengths are plotted relatively brighter than lower $B_1$ field strengths.

With reference to FIG. 3, however, at 7 Tesla the transmit $|B_1^+|$-field (left-hand side of FIG. 3) and receive $|B_1^-|$-field (right-hand side of FIG. 3) show substantial asymmetric inhomogeneity. The regions of maximum sensitivity for transmit and receive do not overlap. As seen in FIG. 3, both the transmit and receive $B_1$ intensity distributions are off-centered toward the bottom region of the phantom. More generally, the non-uniformity is a function of the shape and properties of the selected load at the selected magnetic field of 7 Tesla, and is expected to be exhibited for most coils at high magnetic field (e.g., greater than 3 Tesla). The observed difference in the transmit and receive field simulations (left-hand and right-hand sides of FIG. 3, respectively) is a behavior that generally worsens with increased frequency of operation. It has been observed at 3 Tesla in the body, but the trend to address it at 3 Tesla has generally been to use multi-channel transmit or $B_1$ shimming. Multi-channel transmit solutions tend to be more expensive and complex.

With the recognition of this heretofore generally uncorrected effect, it becomes feasible to design the coil and/or the coil excitation to reduce the effect without substantial hardware and software cost. For example, review of FIG. 3 indicates that the transmit region of sensitivity is rotated relatively to the left while the receive region of sensitivity is rotated relatively to the right. Accordingly, improved overlap of the transmit regions of sensitivity in the bottom region of the phantom is expected by physically rotating the coil element 32 and 34 some degree counter clockwise for transmitting the $B_1$ excitation field. Similarly, improved matching or overlap of the receive region of sensitivity in the bottom region of the phantom is expected by physically rotating coil element 32 and 34 some degree clockwise for receiving the magnetic resonance. In practice, physically rotating coil element 32 and 34 during the MR imaging time is not practical. However, with one more coil element added to the coil 30, the equivalence of physically rotating coil elements for transmitting and for receiving can be accomplished by selectively using two of the three coil elements (or another selected subset of an array of coils) for each function.

More generally, the non-uniform $B_1$-field demonstrated by the FDTD modelling of the half-volume quadrature array coil 30 loaded with the uniform phantom 40, leads to the concept of a spatially selective transmit and spatially selective receive scheme with an array of coil elements. The elements of a transmit/receive (T/R) array coil are selected/detuned with a suitable T/R switch box, which selects some or all of the coil elements for use during the transmit phase and selects (a generally different) some or all of the coil elements for use during the receive phase. A conventional linear or quadrature T/R switch box can be used with additional diode switch circuitry in order to selectively tune/detune selected elements of the array coil during transmit and receive. In some embodiments, the selective excitation and receive configurations are selected based on the object and surface coil geometry with fixed radio frequency (RF) amplitude and 90° quadrature phase. In other embodiments, a phase difference other than 90° is contemplated, depending on coil geometry and $B_1$-field optimization. Optionally, transmission line lengths in the coil array can be adjusted to provide a phase difference of 90° or another selected phase difference.

Figure 4:
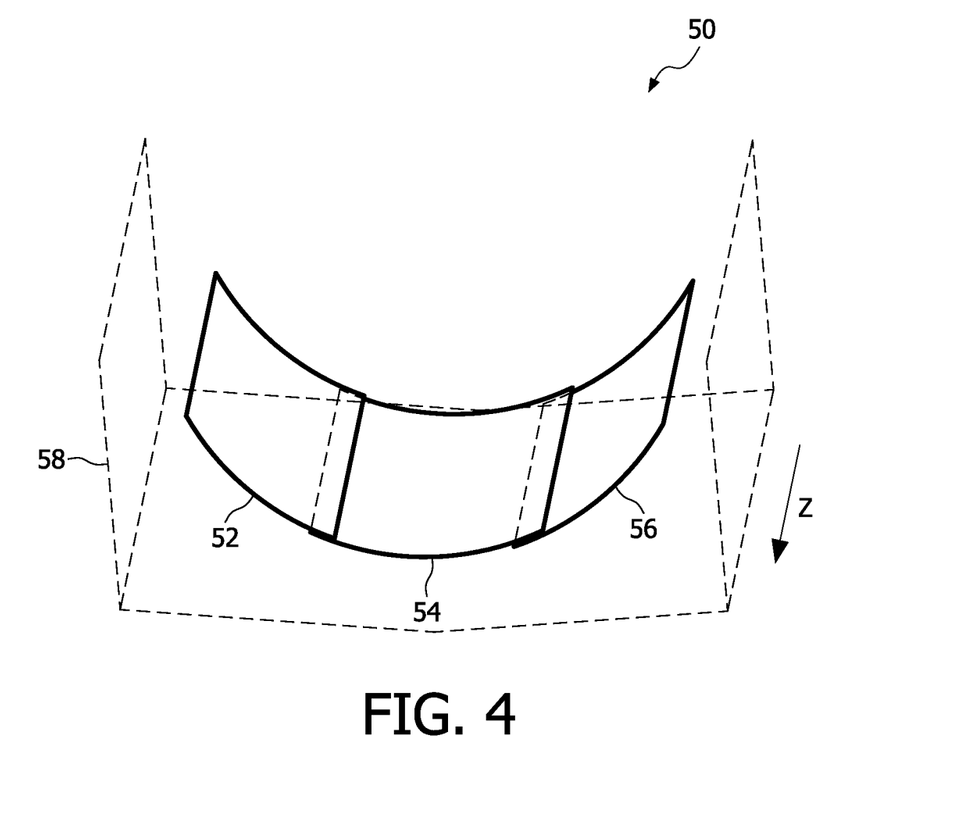
FIG. 4 diagrammatically shows a magnetic resonance coil including three surface coil elements. The coil aligns along the direction of main magnetic field $B_0$ (z-axis)
Figure 5:
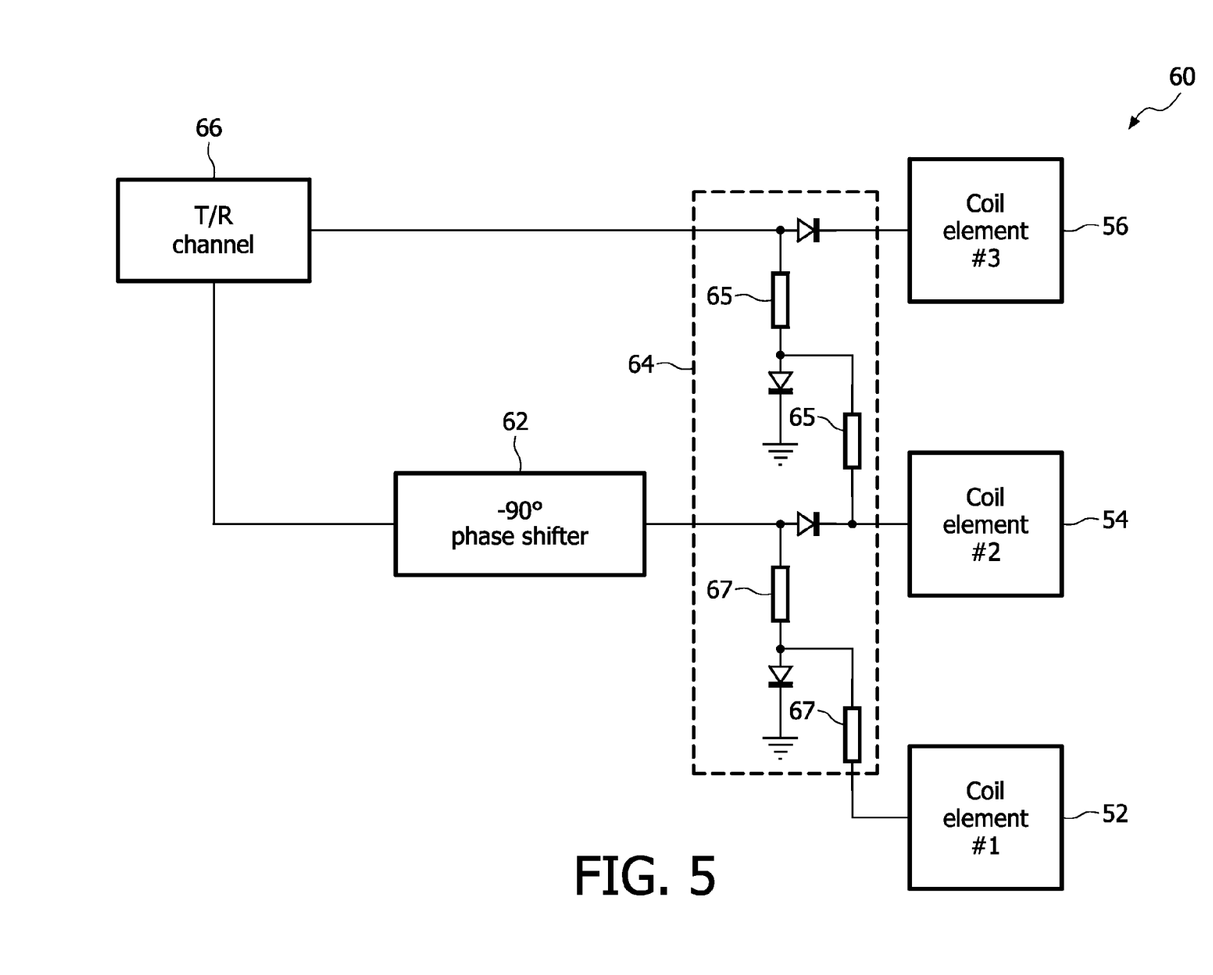
FIG. 5 diagrammatically shows a transmit/receive selection box for use in operating the three-element coil of FIG. 4 using different coil elements (loops) for the transmit and receive phases.

With reference to FIGS. 4 and 5, a magnetic resonance coil 50 is a partial-volume surface coil made of the three curved loop coil elements 52, 54, 56 shielded by a radio frequency shield or screen 58, and is driven by a transmit/receive switch box 60 diagrammatically shown in FIG. 5. In this embodiment, the rightmost two coil elements 54, 56 of the array are used in quadrature mode for the transmit phase, while the leftmost two coil elements 52, 54 of the array are used in quadrature mode for the receive phase. The circuitry of FIG. 5 accomplishes this operation using a −90° phase shifter 62 and switching diodes 64. When all the switching diodes 64 are ON (i.e., conducting), coil elements 54, 56 are driven in quadrature while coil element 52 is disconnected or operatively isolated. This is the configuration for the transmit phase. To ensure that the coil element 52 is disconnected or operatively isolated, connecting transmission line lengths 65, 67 should be quarter-wavelength transmission lines which present a high impedance when the diodes are on. When all the switching diodes 64 are OFF (i.e., non-conducting), coil elements 52, 54 are driven in quadrature while coil element 56 is disconnected or operatively isolated. This is the configuration for the receive phase. The effect of transmitting in quadrature using the two coil elements 54, 56 without the coil element 52 is to transmit with a two-element array rotated to the right. The effect of receiving in quadrature using the two coil elements 52, 54 without the coil element 56 is to receive with a two-element array rotated to the left. Referring back to FIG. 3, it can be seen that the effect of these rotations is to improve the relative alignment or overlap of the transmit and receive regions of sensitivity.

Figure 6:
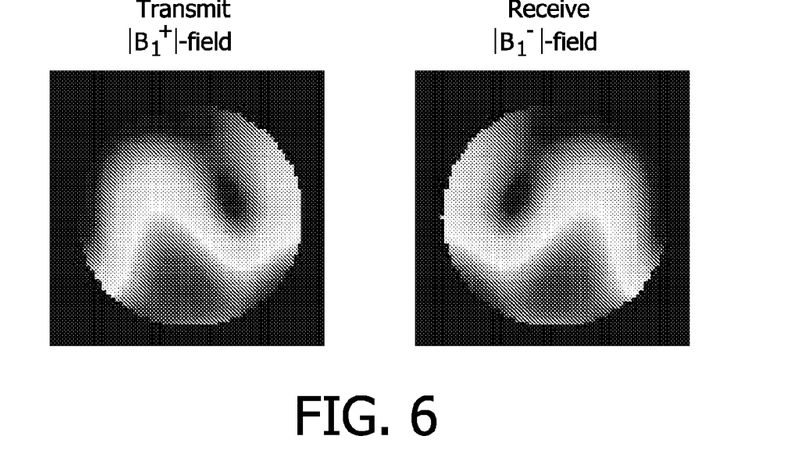
FIG. 6 plots FDTD modeling results of the transmit $|B_1^+|$ field (lefthand side) and receive $|B_1^-|$ field (righthand side) in the center transverse slice for the coil of FIG. 4 loaded with the load of FIG. 2 and operated by the selection box of FIG. 5. Higher $B_1$ field strengths are plotted relatively brighter than lower $B_1$ field strengths.

With reference to FIG. 6, FDTD simulations of the three-element coil 50 support this conclusion, and show that the three-element coil 50 operated using the single transmit/receive channel 66 via the transmit/receive switch box 60 provides transmit and receive regions of sensitivity with good relative alignment, especially in the lower region closest to the three-element coil 50.

Figure 7:
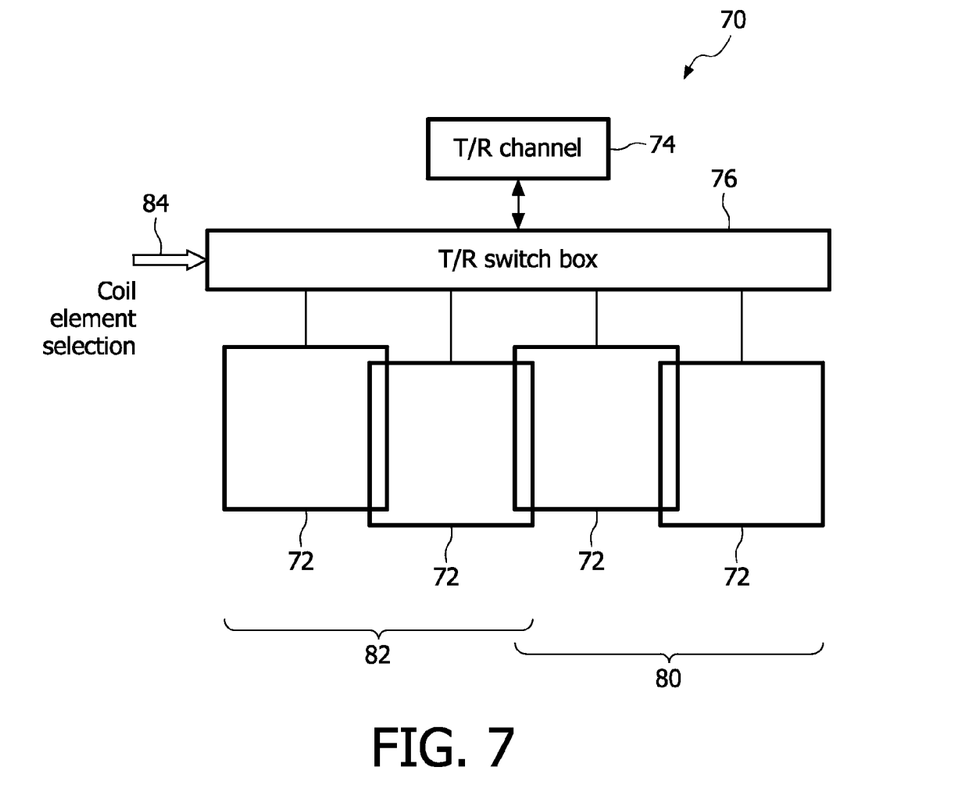
FIG. 7 diagrammatically shows a magnetic resonance coil and a single transmit/receive channel for operating the coil, with an interposed transmit/receive switch box configured to operate the coil using a first sub-set of coil elements for the transmit phase and a second subset of coil elements for the receive phase.

With reference to FIG. 7, in a general arrangement a magnetic resonance coil 70 comprising an array of two or more coil elements 72 (four coil elements 72 in the diagrammatic illustrative example of FIG. 7) are selectively operatively connectable with a single transmit/receive channel 74 by a transmit/receive switch box 76 which is configured to operatively connect a first sub-set 80 of coil elements 72 during the transmit phase and to operatively connect a different (but possibly overlapping) second sub-set 82 of the coil elements 72 during the receive phase. A coil elements selection signal 84 is suitably input to the switch box 76 to change the configuration between the transmit configuration and the receive configuration. For example, the signal 84 can be a binary signal (e.g., "1" for the transmit configuration and "0" for the receive configuration or vice versa) or can be a set of signals individually selecting and deselecting each coil element 72. The transmit sub-set 80 of coil elements is generally positioned asymmetrically respective to the transmit region of sensitivity, and similarly the receive sub-set 82 of coil elements is generally positioned asymmetrically respective to the receive region of sensitivity. The sub-sets 80, 82 are selected such that the transmit and receive regions of sensitivity are substantially similar. For example, "substantial similarity" may be satisfied by having at least the region of maximum sensitivity for transmit and receive overlap in space. This is accomplished by recognizing and accommodating the asymmetries between the coil elements used for excitation or reception and their respective transmit and receive regions of sensitivity. The result is that the first sub-set of coil elements used for transmit and the second sub-set of coil elements used for receive are positioned asymmetrically respective to each other so as to provide substantially similar transmit and receive regions of interest. In some embodiments, the effect of this accommodation is that the transmit region of sensitivity and the substantially similar receive region of sensitivity are each positioned substantially symmetrically respective to a union of the first and second sub-sets 80, 82 of coil elements. Similarly, in some embodiments in which there are some common coils that are members of both the first and second sub-sets 80, 82 of coil elements, the set of one or more common coil elements is positioned substantially symmetrically respective to the substantially similar transmit and receive regions of sensitivity. For example, in the three-element coil 50 of FIG. 4, the common coil element 54 is positioned substantially symmetrically respective to the substantially similar transmit and receive regions of sensitivity as indicated by the FDTD simulations of FIG. 6.

In accommodating the asymmetries, the first set 80 of coil elements and the second set 82 of coil elements are spatially offset from each other and have at least one coil element not in common. In some embodiments, such as the illustrative embodiment of FIG. 4 where the first sub-set of coil elements includes the coil elements 54, 56 and the second sub-set of coil elements includes the coil elements 52, 54, the two sub-sets have one or more coil elements in common (namely coil element 54 in the example of FIG. 4). In other embodiments, the two sub-sets may have no coil elements in common.

At a magnetic field strength greater than 3 Tesla, or more predominantly greater than 5 Tesla, or still more predominantly at greater than 7 Tesla, the transmit $|B_1^+|$ and receive $|B_1^-|$ distribution patterns are substantially influenced by the load imposed by the imaged object or subject. As a result, the transmit and receive $B_1$ distributions are generally not uniform or symmetric, and (as shown herein) are generally different for the transmit and receive phases when the same coil elements are used for both phases. Accordingly, it is disclosed herein to use a non-symmetric selection of coil elements for the transmit and receive phases, respectively, with the surprising result that the transmit and receive regions of sensitivity can be made substantially similar for a given load at a particular magnetic field strength by suitable selection of the different transmit and receive coil element sub-sets. For a specific array coil designed for specific anatomy imaging, the selection of transmit and receive coil element sub-sets can be made based on $B_1$-map measurements or numerical calculations to determine which elements to use for transmit and which elements to use for receive. Additionally, such mapping or numerical calculation can be used to adjust or optimize positions of individual coil elements to further enhance the substantial similarity of the transmit and receive regions of sensitivity. Similarly, the phase shift of the nominally quadrature operation can be adjusted for this purpose in embodiments that employ quadrature excitation and reception.

In the illustrated embodiments, the coil elements have been shown as single loop surface coil elements. More generally, the coil elements can be single-loop surface coil elements, multiple-loop surface coil elements, tuned axial stripline surface coil elements, other types of coil elements, or various combinations thereof. In addition the array of coils may consist of adjacent groups of coils in the axial direction to increase coverage of the selected anatomy. For example, the coil illustrated in FIG. 4 may be duplicated in the axial direction to create two such coils that are selectively chosen based on the region of interest. In this way greater anatomical coverage can be obtained. While the illustrated embodiments employ surface coils, other non-volumetric arrays of coil elements are similarly expected to exhibit asymmetry in the transmit and receive regions of sensitivity when operated as a unit, and can similarly be improved upon by addition of a transmit/receive switch box that selects different sub-sets of coil elements for use in transmission and reception so as to provide substantially similar transmit and receive regions of sensitivity. In the illustrated embodiments, the single transmit/receive channel has been operatively connected to the coils for transmit or receive in quadrature. However, a linear operative connection or other electrical connection is also contemplated, or the transmit and receive channels can be arranged separately.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

Having thus described the preferred embodiments, the invention is now claimed to be:

1. A magnetic resonance coil comprising:
   a first set of coil elements operatively connectable with a transmit channel to couple with a transmit region of sensitivity for a selected load at a magnetic field strength, the first set of coil elements being arranged proximate to but not surrounding the transmit region of sensitivity; and
   a second set of coil elements operatively connectable with a receive channel to couple with a receive region of sensitivity for the selected load at the magnetic field strength, the second set of coil elements being arranged proximate to but not surrounding the receive region of sensitivity;
   wherein the first set of coil elements and the second set of coil elements have at least one coil element not in common; and
   wherein the first and second sets of coil elements define substantially similar transmit and receive regions of sensitivity for the selected load at the magnetic field strength,
   wherein the first set of coil elements are assigned to a transmit phase and the second set of coil elements are assigned to a receive phase, and
   wherein the first set of coil elements is rotationally offset from the second set of coil elements.

2. The magnetic resonance coil as set forth in claim 1, wherein the first set of coil elements and the second set of coil elements have at least one coil element in common.

3. The magnetic resonance coil as set forth in claim 1, wherein the first set of coil elements includes:
   a first sub-set of one or more coil elements connectable with the transmit channel at a first phase, and a second sub-set of one or more coil elements connectable with the transmit channel at a second phase in 90° quadrature respective to the first phase;
   and the second set of coil elements includes:
   a first sub-set of one or more coil elements connectable with the receive channel at a first phase, and
   a second sub-set of one or more coil elements connectable with the receive channel at a second phase in 90° quadrature respective to the first phase.

4. The magnetic resonance coil as set forth in claim 1, wherein the first set of coil elements includes:
   a first sub-set of one or more coil elements connectable with the transmit channel at a first phase, and
   a second sub-set of one or more coil elements connectable with the transmit channel at a second phase different from the first phase;
   and the second set of coil elements includes:
   a first sub-set of one or more coil elements connectable with the receive channel at a third phase, and
   a second sub-set of one or more coil elements connectable with the receive channel at a fourth phase different from the third phase.

5. The magnetic resonance coil as set forth in claim 4, wherein the phase difference between the first and second phases and the phase difference between the third and fourth phases is selected by adjustment of transmission line lengths in the corresponding coil elements.

6. The magnetic resonance coil as set forth in claim 1, wherein each coil element of the first set of coil elements and of the second set of coil elements is a surface coil element disposed on or proximate to the selected load.

7. The magnetic resonance coil as set forth in claim 6, wherein each surface coil element of the first set of coil elements and of the second set of coil elements is selected from a group consisting of (i) a single-loop surface coil element, (ii) a multiple-loop surface coil element, and (iii) a tuned axial stripline surface coil element.

8. The magnetic resonance coil as set forth in claim 1, wherein the transmit region of sensitivity is positioned asymmetrically respective to the first set of coil elements and the substantially similar receive region of sensitivity is positioned asymmetrically respective to the second set of coil elements.

9. The magnetic resonance coil as set forth in claim 8, wherein the transmit region of sensitivity and the substantially similar receive region of sensitivity are each positioned substantially symmetrically respective to a union of the first and second sets of coil elements.

10. The magnetic resonance coil as set forth in claim 1, wherein:
    the first set of coil elements and the second set of coil elements are positioned asymmetrically respective to each other; and
    the transmit region of sensitivity and the substantially similar receive region of sensitivity are each positioned substantially symmetrically respective to a union of the first and second sets of coil elements.

11. The magnetic resonance coil as set forth in claim 1, wherein:
    the second set of coil elements is spatially offset from the first set of coil elements; and
    the transmit region of sensitivity and the substantially similar receive region of sensitivity are each positioned substantially centered respective to a union of the first and second sets of coil elements.

12. A magnetic resonance method comprising:
    selectively activating an asymmetrically positioned first set of coil elements for a transmission phase and a differently asymmetrically positioned second set of coil elements for a receive phase;
    generating magnetic resonance in a selected region of sensitivity of a selected load at a magnetic field strength using the asymmetrically positioned first set of coil elements, the asymmetrically positioned first set of coil elements being positioned respective to the selected region of sensitivity of the selected load at the magnetic field strength; and
    receiving a magnetic resonance signal from the selected region of sensitivity of the selected load at the magnetic field strength using the differently asymmetrically positioned second set of coil elements, the differently asymmetrically positioned second set of coil elements being positioned asymmetrically respective to the selected region of sensitivity of the selected load at the magnetic field strength, the asymmetric position of the second set of coil elements respective to the selected region of sensitivity being different from the asymmetric position of the first set of coil elements respective to the selected region of sensitivity,
    wherein the asymmetrically positioned first set of coil elements is rotationally offset from the differently asymmetrically positioned second set of coil elements.

13. The magnetic resonance method as set forth in claim 12, wherein a union of the first set of coil elements and the second set of coil elements is positioned substantially symmetrically respective to the selected region of sensitivity.

14. The magnetic resonance method as set forth in claim 12, wherein the generating comprises:
    energizing a first sub-set of one or more coil elements of the first set of coil elements at a first phase; and
    energizing a second sub-set of one or more coil elements of the first set of coil elements at a second phase in quadrature respective to the first phase.

\* \* \* \* \*